(12) United States Patent
Howell

(10) Patent No.: US 12,003,097 B2
(45) Date of Patent: Jun. 4, 2024

(54) DETECTING AND REPORTING THE STATUS OF AN OVERVOLTAGE PROTECTION DEVICE

(71) Applicant: ROBE lighting s.r.o., Roznov pod Radhostem (CZ)

(72) Inventor: Wayne Howell, Bovey Tracey (GB)

(73) Assignee: ROBE lighting s.r.o., Roznov pod Radhostem (CZ)

( * ) Notice: Subject to any disclaimer, the term of this patent is extended or adjusted under 35 U.S.C. 154(b) by 0 days.

(21) Appl. No.: 18/455,352

(22) Filed: Aug. 24, 2023

(65) Prior Publication Data

US 2023/0402838 A1  Dec. 14, 2023

Related U.S. Application Data

(60) Provisional application No. 63/402,308, filed on Aug. 30, 2022.

(51) Int. Cl.
*H02H 9/06* (2006.01)
*H02H 9/04* (2006.01)

(52) U.S. Cl.
CPC .............. *H02H 9/06* (2013.01); *H02H 9/042* (2013.01)

(58) Field of Classification Search
CPC .......... H02H 9/06; H02H 9/044; H02H 9/046; H02H 9/045; H02H 9/042; H02H 3/22; H01C 7/12; H01T 4/00
USPC .................................................. 361/117–120
See application file for complete search history.

(56) References Cited

U.S. PATENT DOCUMENTS

| | | | | |
|---|---|---|---|---|
| 5,323,289 | A * | 6/1994 | Longsdorf | H02H 9/06 361/111 |
| 2013/0128401 | A1* | 5/2013 | Tsaur | H01T 4/00 361/56 |
| 2014/0218201 | A1 | 8/2014 | Meyer et al. | |
| 2015/0280428 | A1* | 10/2015 | Wiese | H02H 9/041 174/27 |
| 2015/0364916 | A1* | 12/2015 | Chung | H04L 25/00 361/91.2 |

(Continued)

OTHER PUBLICATIONS

Partial European Search Report; Application No. 231940651; Feb. 9, 2024; 16 pages.

*Primary Examiner* — Danny Nguyen
(74) *Attorney, Agent, or Firm* — Conley Rose, P.C.; Brooks W Taylor

(57) ABSTRACT

A first overvoltage protection and reporting system comprises input and output transceivers and input and output surge protection devices coupled respectively to the input and output transceivers. The input surge protection device includes first and second gas discharge tubes coupled to the input transceiver only at, respectively, a first input and a second input. The output surge protection device includes third and fourth gas discharge tubes coupled to the output transceiver only at, respectively, a first and a second output. A second overvoltage protection and reporting system comprises input and output transceivers, a processor coupled between the input and output transceivers, and an output surge protection system that includes a surge protection device coupled to the output transceiver and a sensor receiver coupled between the output transceiver and the processor. The processor detects a failure of the surge protection device based on a signal received from the sensor receiver.

18 Claims, 3 Drawing Sheets

(56) References Cited

U.S. PATENT DOCUMENTS

2022/0329064 A1* 10/2022 Wang .................. H01C 7/12
2023/0238794 A1*  7/2023 Golob .................. H02H 9/04
                                                    361/91.1

* cited by examiner

DETECTING AND REPORTING THE STATUS OF AN OVERVOLTAGE PROTECTION DEVICE

CROSS-REFERENCE TO RELATED APPLICATIONS

This patent application claims the benefit of U.S. Provisional Application No. 63/402,308, filed Aug. 30, 2022, entitled "DETECTING AND REPORTING THE STATUS OF AN OVERVOLTAGE PROTECTION DEVICE" which is hereby incorporated by reference in its entirety.

TECHNICAL FIELD OF THE DISCLOSURE

This disclosure generally relates to surge protection for data circuits and, more specifically, to systems and methods for detecting and reporting the status of devices used in overvoltage protection.

BACKGROUND

Electronic devices (e.g., data transmission circuits), such as those used outdoors, are subject to damage from voltage surges and other high voltage events, such as a nearby lightning strike. As a result, surge protection systems may be desired (or even possibly required) for outdoor electronic devices. For instance, the European Electrical Installation Regulations require protection against "Transient Overvoltages of Atmospheric Origin" in electronic devices.

SUMMARY

In a first embodiment, an overvoltage protection and reporting system comprises an input transceiver comprising a first input and a second input, an output transceiver comprising a first output and a second output, and an input and output surge protection system. The input and output surge protection system comprises an input surge protection device coupled to an input of the input transceiver, the input surge protection device including a first gas discharge tube coupled to the input transceiver only at the first input and a second gas discharge tube coupled to the input transceiver only at the second input. The input and output surge protection system further comprises an output surge protection device coupled to an output of the output transceiver, the output surge protection device including a third gas discharge tube coupled to the output transceiver only at the first output and a fourth gas discharge tube coupled to the output transceiver only at the second output.

In a second embodiment, an overvoltage protection and reporting system comprises an input transceiver, an output transceiver, a processor coupled between the input transceiver and the output transceiver, and an output surge protection system. The output surge protection system comprises an output surge protection device coupled to an output of the output transceiver and a sensor receiver coupled between the output of the output transceiver and the processor. The processor is configured to detect a failure of the output surge protection device based on a signal received by the sensor receiver.

BRIEF DESCRIPTION OF THE DRAWINGS

For a more complete understanding of this disclosure, reference is now made to the following brief description, taken in conjunction with the accompanying drawings in which like reference numerals indicate like features.

DETAILED DESCRIPTION

Various embodiments of the disclosure are illustrated in the figures, and like numerals are used to refer to like and corresponding parts of the drawings.

Electronic devices (e.g., data transmission circuits), such as those used outdoors, are subject to damage from voltage surges and other high voltage events, such as a nearby lightning strike. As a result, electronic devices may include surge protection systems to protect against such high voltage events. Some surge protection systems include gas discharge tube (GDT) devices, which may fail if high voltage events are repeated or dissipate too much energy. The failure mode of a GDT device is part of its design. The GDT is designed to fail to either an open-circuit configuration or a closed-circuit configuration. In either case, the GDT is sacrificial in that the designed failure mode protects the connected electronic device and the GDT may require replacement. However, in some surge protection systems, the failure of a GDT may not be detected or reported to an operator or monitoring system. As a result, such surge protection systems present the technical problem that the protected connected electronic device may become unprotected once the GDT has failed without the operator being notified.

In some surge protection systems, two GDT devices may be used, with one GDT device used as protection for the data lines ("data circuit GDT"), and another, standalone GDT device used solely for the purposes of failure detection ("reporting circuit GDT"). The reporting circuit GDT is located physically near the data circuit GDT, in the expectation that the heat generated by the data circuit GDT as it fails will also cause the reporting circuit GDT to fail. Such systems work on the assumption that both GDT devices fail at the same time. However, in practice, it may be the case that only one of the two parallel GDT devices fails. This may lead to a false report that the data circuit GDT has failed when in fact it is only the reporting circuit GDT that has failed or, alternatively, to a false report that the data circuit GDT is operational where the reporting circuit GDT is still operational but the data circuit GDT has failed.

To solve these problem with such systems, some embodiments disclosed herein include systems in which a single GDT is used on an input line and a single GDT is used on an output line, both for high voltage protection and failure detection. These embodiments provide reliable high voltage protection on both inputs and outputs and reliable failure detection on the outputs. In addition, some embodiments disclosed herein include systems that include a pair of GDTs on an input line and a pair of GDTs on an output line. These embodiments provide both reliable high voltage protection and reliable failure detection on both the inputs and the outputs.

Figure 1:
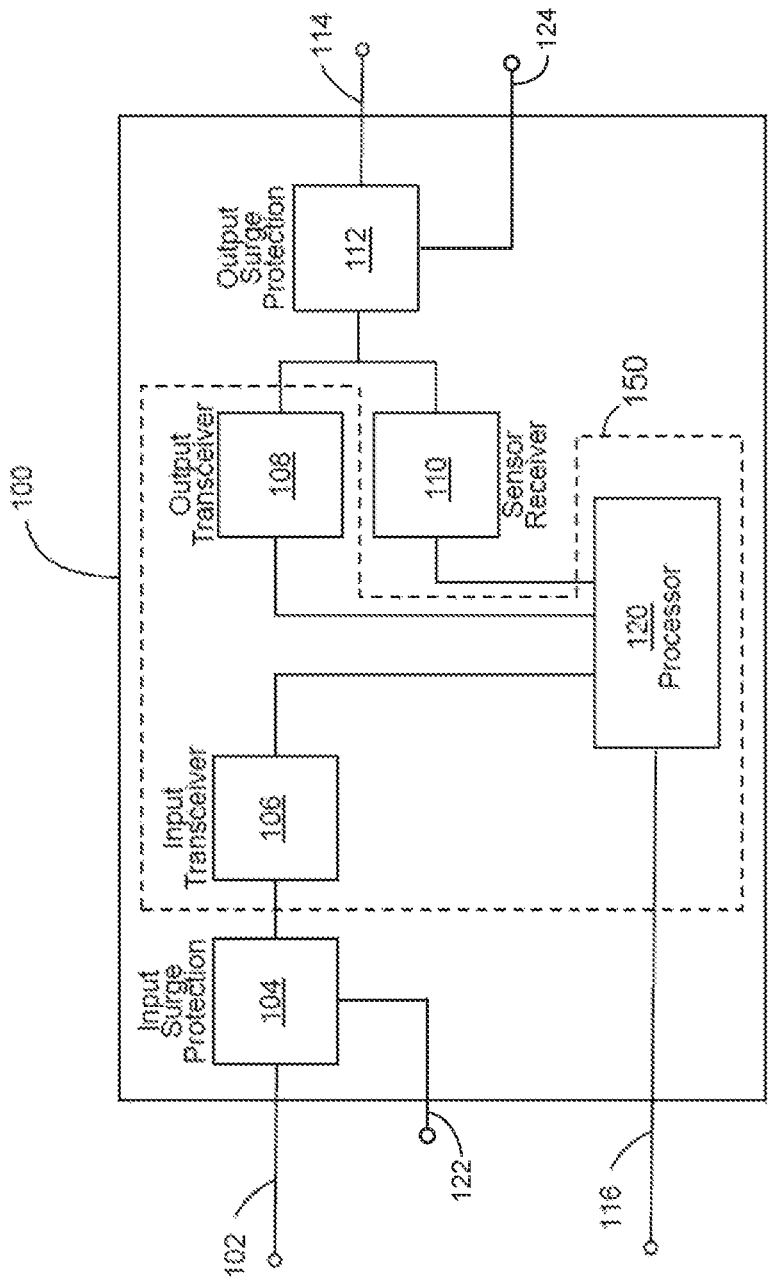
FIG. 1 presents a diagram of an overvoltage protection and reporting system for an electronic device according to some embodiments of the disclosure.

FIG. 1 presents a diagram of an overvoltage protection and reporting system 100 according to some embodiments of the disclosure. The overvoltage protection and reporting system 100 illustrates a system for receiving, processing, and transmitting data on electrical transmission lines.

The overvoltage protection and reporting system 100 includes an electronic device 150 that is coupled between an input surge protection system 104 and an output surge protection system 112. The electronic device 150 may comprise any suitable device, circuit, or collection thereof for transmitting, converting, or otherwise utilizing a data signal. The electronic device 150 may include an input transceiver 106, an output transceiver 108, and a processor 120 coupled between the input transceiver 106 and output transceiver 108. More details relating to the processor 120 are provided below, but it should be initially appreciated that the processor 120 is configured to monitor for a failure of the output surge protection system 112 during operations.

Incoming data signals on an input 102 pass through the input surge protection system 104 before entering input transceiver 106. Input surge protection system 104 includes a gas discharge tube (GDT) and may also include other overvoltage protection devices, such as transient voltage surge suppressors and electronic current limiters (ECLs) that guard against lightning, power induction, power cross, earth potential rise, and other energy surges. In some embodiments, the GDT may be of a type that is designed to fail to a closed-circuit (or short circuit) configuration. Such GDT devices may include a fusible device that melts when excess energy is dissipated, releasing an internal spring and bar that short circuits the terminals. Once such a GDT has failed in this manner, it is not resettable and must be replaced. Input transceiver 106 may include standard data isolation and receiving circuitry such as might be used with serial data transmission systems including, but not limited to, EIA-485, DMX512, RDM, DALI, ethernet, RS-232, RS-422, USB, BACnet, SPI, and CANbus.

Data from input transceiver 106 may be received under the control of, and passed to, processor 120. Processor 120 may be electrically coupled to a memory. The memory may include machine-readable instructions that, when executed by the processor 120, cause the processor 120 to perform the various operations and functions described herein. Processor 120 may be implemented by hardware and software. The processor 120 may be implemented as one or more central processing unit (CPU) chips, cores (e.g., as a multi-core processor), field-programmable gate arrays (FPGAs), application specific integrated circuits (ASICs), microcontrollers, microprocessors, discrete logic, and digital signal processors (DSPs). The processor 120 may be further electrically coupled to and in communication with one or more communication interfaces to other devices.

Processor 120 may pass data to output transceiver 108. As with input transceiver 106, output transceiver 108 may include standard data isolation and transmission circuitry such as might be used with serial data transmission systems including, but not limited to, EIA-485, DMX512, RDM, DALI, ethernet, RS-232, RS-422, USB, BACnet, SPI, and CANbus. Output transceiver 108 translates the commands and data from processor 120 into voltage and current signals to be transmitted via the output 114. An output from output transceiver 108 is split and connects to both output surge protection system 112 and sensor receiver 110. Signals transmitted into input transceiver 106 and out of output transceiver 108 may be single-ended signals or differential signals, and may be balanced line or unbalanced line signals.

Output surge protection system 112 includes a GDT and may also include other overvoltage protection devices, such as transient voltage surge suppressors and electronic current limiters (ECLs) that guard against lightning, power induction, power cross, earth potential rise, and other energy surges. In some embodiments, the GDT may be of the type that is designed to fail to a closed-circuit configuration. The data signals from output surge protection system 112 are output from the overvoltage protection and reporting system 100 through output 114 to ongoing transmission lines (or other suitable locations and devices).

As discussed above, sensor receiver 110 also receives an output from the output transceiver 108 and then converts this received signal to data that is then sent to processor 120. In operation, processor 120 compares the data received from the sensor receiver 110 with known data. Such comparison may be done continually, periodically, or when triggered by the user, an event, or a received signal. As an example, in the case of the overvoltage protection and reporting system 100 being used as a data repeater, the known data may be the data received from the input transceiver 106 and processor 120 can confirm that the data being transmitted is the same as or intrinsically related to that being received. If an overvoltage event, such as a lightning strike, occurs and the GDT in the output surge protection system 112 fails, such failure will cause a short circuit of data lines of the output 114 and thus prevent sensor receiver 110 from detecting any data from the output of output transceiver 108. Processor 120 will then recognize this situation and can report the failure. Thus, the processor 120 may determine that the GDT of output surge protection system 112 has failed based on a difference between data received from the input transceiver 106 and data received from the sensor receiver 110.

In some embodiments, the input surge protection system 104 generates an input fail sense output 122 that indicates an overvoltage event in the input surge protection system 104. Similarly, in some embodiments, the output surge protection system 112 generates an output fail sense output 124 that indicates an overvoltage event in the output surge protection system 112. In some embodiments, input fail sense output 122 and output fail sense output 124 may be monitored by an external device.

Failure reporting may be through a dedicated data line such as data line 116, which may be an open-drain connection, or may be through an alternative data path. In one embodiment, an external controlling system (e.g., computer system, network node, etc.) may be coupled to processor 120 via data line 116. Processor 120 is configured to report a failure by sending data back through data line 116 to the controlling system. Other methods for reporting a failure, such as wireless or other data communication, may be used in various embodiments. By way of example, processor 120 may include a wireless transceiver (e.g., Bluetooth transceiver, WIFI transceiver) that communicated with an external wireless node that is part of an error reporting system. Thus, the same single GDT device inside output surge protection system 112 provides both line protection and, through sensor receiver 110, detection of GDT failure.

In some embodiments, the input transceiver 106 may be configured as a receiver only. In addition, in some embodiments, the output transceiver 108 may be configured as a transmitter only. Further, in some embodiments, the sensor receiver 110 may be configured as a transceiver. In some embodiments, the processor 120 may be implemented as separate first and second processors. The first processor may operate to interconnect the input transceiver 106 and the output transceiver 108. The second processor may operate to monitor data received from the sensor receiver 110 and report failure of the output surge protection system 112.

Figure 2:
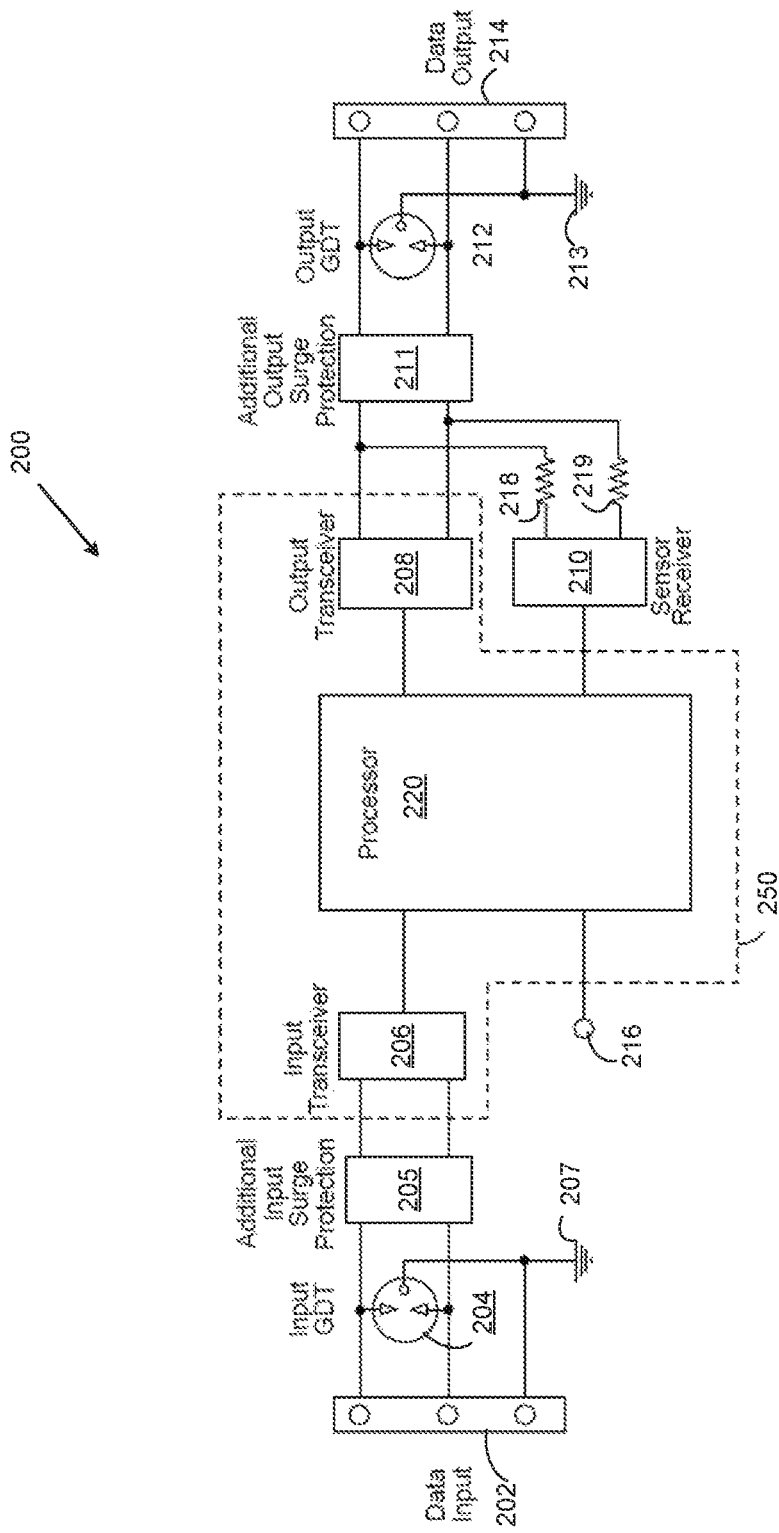
FIG. 2 presents a block diagram of a first overvoltage protection and reporting system according to the disclosure.

FIG. 2 presents a block diagram of a first overvoltage protection and reporting system 200 according to the disclosure. The system of FIG. 2 includes an electronic device 250 that is coupled between an input gas discharge tube (GDT) 204 and an output gas discharge tube (GDT) 212. The electronic device 250 may comprise any suitable device, circuit, or collection therefor for transmitting, converting, or otherwise utilizing a data signal. The electronic device 250 may include an input transceiver 206, an output transceiver 208, and a processor 220 coupled between the input transceiver 206 and output transceiver 208. More details relating to the processor 220 are provided below, but it should be initially appreciated that the processor 220 is configured to monitor for a failure of the output GDT 212 during operations.

An incoming data signal on data input connector 202 is connected to input GDT 204. The data input connector 202 comprises two data lines and a common line. In some embodiments, input GDT 204 may be of the type that is designed to fail to a closed-circuit configuration. As shown, input GDT 204 is a three-terminal device with two input pins connected to the data lines of the data input connector 202 and a third pin connected to the ground line of the data input connector 202 and a data ground 207. If input GDT 204 fails, then all three pins are connected together such that the data lines are connected to the data ground 207. In some embodiments, input GDT 204 may be a two terminal device where there is no ground connection and instead failure of the input GDT 204 results in just the two data lines being connected together.

After input GDT 204, the incoming signal is coupled to additional input surge protection circuitry 205. Additional input surge protection circuitry 205 may include over voltage protection devices such as transient voltage surge suppressors and electronic current limiters (ECLs) that guard against lightning, power induction, power cross, earth potential rise, and other energy surges. Collectively, input GDT 204 and additional input surge protection circuitry 205 comprise the input surge protection system 104 of FIG. 1.

After passing through the input GDT 204 and the additional input surge protection circuitry 205, the data signal enters input transceiver 206. Input transceiver 206 may include standard data isolation and receiving circuitry such as might be used with serial data transmission systems including, but not limited to, RS-485, DMX512, RDM, DALI, ethernet, RS-232, RS-422, USB, and CANbus. Data from input transceiver 206 may be received under the control of, and passed to, processor 220.

Processor 220 may be electrically coupled to a memory. The memory may include machine-readable instructions that, when executed by the processor 220, cause the processor 220 to perform the various operations and functions described herein. Processor 220 may be implemented by hardware and software. The processor 220 may be implemented as one or more Central Processing Unit (CPU) chips, cores (e.g., as a multi-core processor), field-programmable gate arrays (FPGAs), application specific integrated circuits (ASICs), microcontrollers, discrete logic, and digital signal processors (DSPs). The processor 220 may be further electrically coupled to and in communication with one or more communication interfaces to other devices.

Processor 220 may pass data to output transceiver 208. As with data input transceiver 206, data output transceiver 208 may include standard data isolation and transmission circuitry such as might be used with serial data transmission systems including, but not limited to, RS-485, DMX512, RDM, DALI, ethernet, RS-232, RS-422, USB, and CANbus. Data output transceiver 208 translates the commands and data from processor 220 into outgoing voltage and current signals to be transmitted via data output connector 214. The data output connector 214 comprises two data lines and a common line coupled to data ground 213. As discussed with reference to FIG. 1, signals transmitted into input transceiver 206 and out of output transceiver 208 may be single-ended signals or differential signals, and may be balanced line or unbalanced line signals.

The output from output transceiver 208 is split and connects to both additional output surge protection circuitry 211 and sensor receiver 210. Additional output surge protection circuitry 211 may include other overvoltage protection devices, such as transient voltage surge suppressors and electronic current limiters (ECLs) that guard against lightning, power induction, power cross, earth potential rise, and other energy surges.

The data signals from additional output surge protection circuitry 211 then connect to the data output connector 214 via the output GDT 212. In some embodiments, output GDT 212 may be of the type that is designed to fail to a closed-circuit configuration. As shown, output GDT 212 is a three-terminal device with two input pins connected to the data lines and a third pin connected to data ground 213. Data ground 207 and data ground 213 may not be interconnected and there may be a potential difference between them. If output GDT 212 fails, then all three pins are connected together such that the data lines are connected to data ground 213. In other embodiments, output GDT 212 may be a two terminal device where there is no ground connection and instead failure of output GDT 212 results in just the two data lines being connected together.

In other embodiments, a plurality of fail-open GDT devices may be connected in series and the system may detect lack of signal received from a half-duplex data transmission. Collectively, output GDT 212 and additional output surge protection circuitry 211 comprise output surge protection system 112 of FIG. 1. Finally, the outgoing voltage and current signals pass out through data output connector 214 to outgoing transmission lines.

As discussed above, the output data from data output transceiver 208 is also coupled to the input of data sensor receiver 210 via resistors 218 and 219. Within the data sensor receiver 210, the received output from data output transceiver 208 is converted to data sent to processor 220. Resistors 218 and 219 serve to attenuate the signal such that internal impedance of the circuitry (circuitry downstream of the output transceiver 208, including surge protection circuitry 211, output GDT 212, and components that may be coupled to the data output connector 214) is insufficient to provide false reception of output data from the data output transceiver 208 by the data sensor receiver 210 even though output GDT 212 has failed and is shorting the outgoing data lines. In some embodiments, resistors 218 and 219 each have an electrical resistance of 680 kilohms. In some embodiments, data sensor receiver 210 may be of a different type with lower sensitivity or may be a comparator or other device.

In operation, firmware and/or software running within processor 220 compares the data received from the data sensor receiver 210 with known data. Such comparison may be done continually, periodically, or when triggered by the user or an event. As an example, in the case of the system being used as a data repeater, the known data may be the data received from the data input transceiver 206, and processor 220 can confirm that the data being transmitted is the same as that being received. If an overvoltage event, such as a lightning strike, occurs and output GDT 212 fails, such failure will cause a short circuit of the data lines and thus prevent data sensor receiver 210 from detecting data from the output of data output transceiver 208. Processor 220 will then recognize this situation and can report the failure. Thus, the processor 220 may determine that the GDT of output surge protection device 212 has failed based on a difference between data received from the input transceiver 206 and the sensor receiver 210.

In some embodiments of the disclosure, resistors 218 and 219 and data sensor receiver 210 are chosen such that a short of the data output connector 214 will be detected whether such short is because of failure of output GDT 212 or if any external failure has caused data output connector 214 to become shorted. For example, a failure of an external device connected to data output connector 214 may cause the short which is now detected and reported.

Failure reporting may be through a dedicated data line such as data line 216, which may be an open-drain connection, or may be through an alternative data path. In one embodiment, an external controlling system (e.g., computer system, network node, etc.) may be coupled to processor 220 via data line 216. Processor 220 is configured to report a failure by sending data back through data line 216 to the controlling system. Other methods for reporting a failure, such as wireless or other data communication, may be used in various embodiments. By way of example, processor 220 may include a wireless transceiver (e.g., Bluetooth transceiver, WIFI transceiver) that communicated with an external wireless node that is part of an error reporting system.

In some embodiments, the input transceiver 206 may be configured as a receiver. In addition, in some embodiments, the output transceiver 208 may be configured as a transmitter. Further, in some embodiments, the sensor receiver 210 may be configured as a transceiver. In some embodiments, the processor 220 may be implemented as separate first and second processors. The first processor may operate to interconnect the input transceiver 206 and the output transceiver 208. The second processor may operate to monitor data received from the data sensor receiver 210 and report failure of the output surge protection device 212.

Although the embodiment described is for a data repeater, the disclosure is not so limited and the described overvoltage detection and reporting system may be used in any unidirectional or bi-directional data transmitter or receiver or in power distribution systems.

Figure 3:
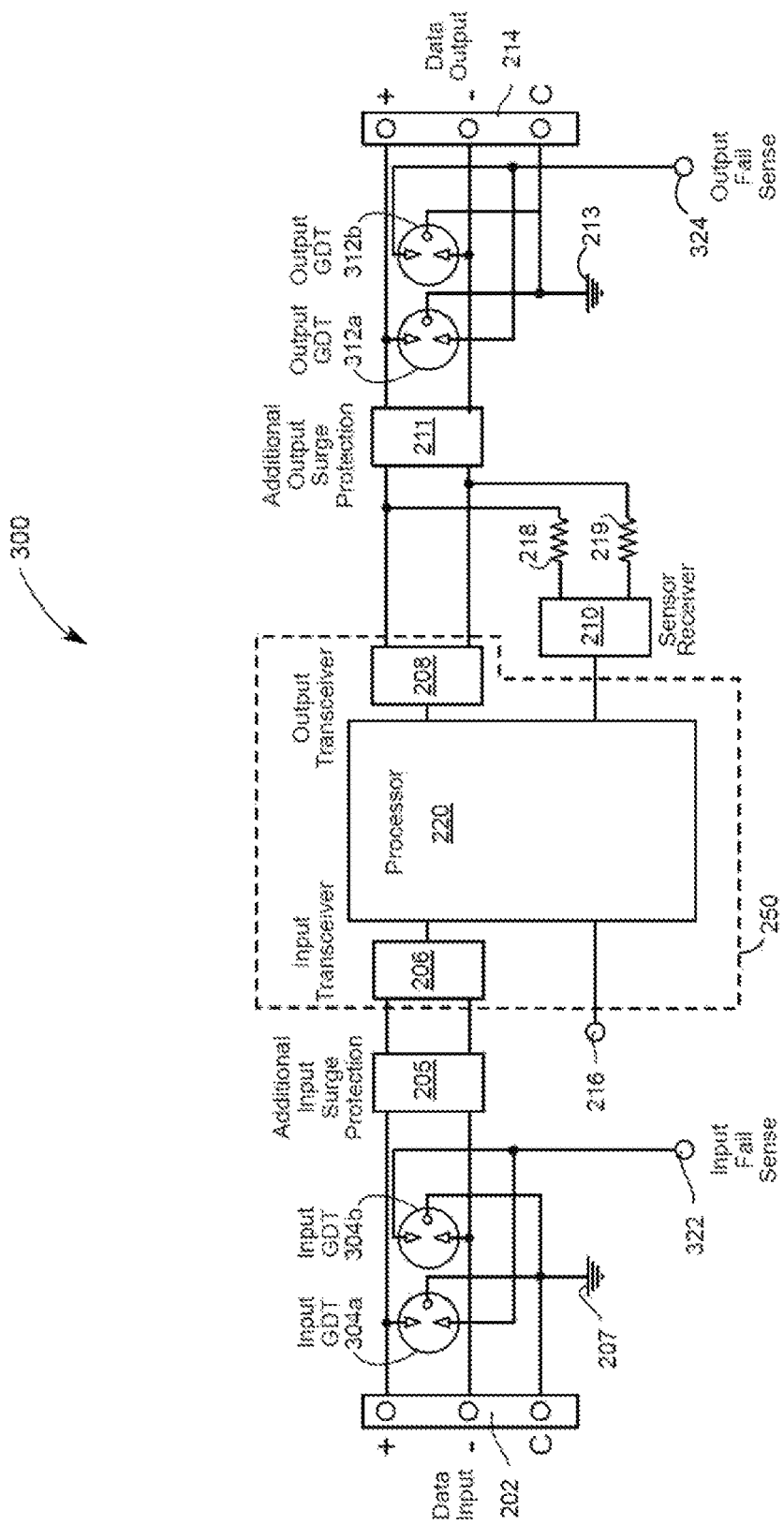
FIG. 3 presents a block diagram of a second overvoltage protection and reporting system according to the disclosure.

FIG. 3 presents a block diagram of a second overvoltage protection and reporting system 300 according to the disclosure. The disclosed embodiment replaces the single input GDT 204 shown in FIG. 2 with input GDTs 304a and 304b on data input connector 202, and replaces single output GDT 212 shown in FIG. 2 with output GDT devices 312a and 312b on data output connector 214

On data input connector 202, input GDT 304a has a first terminal connected to the positive side of data input connector 202 and a second terminal connected to input fail sense output 322. The third terminal of input GDT 304a is connected to data ground 207. If input GDT 304a fails, then first, second, and third terminals will be connected together. Thus, the positive side of data input connector 202 and the input fail sense output 322 will be pulled down to data ground 207.

Similarly, input GDT 304b has a first terminal connected to the negative side of data input connector 202 and a second terminal connected to input fail sense output 322. The third terminal of input GDT 304b is connected to data ground 207. If input GDT 304b fails, then first, second, and third terminals will be connected together. Thus, the negative side of data input connector 202 and the input fail sense output 322 will be pulled down to data ground 207. Failure of either one or both of input GDT 304a or input GDT 304b will pull one side of data input connector 202 and the input fail sense output 322 to data ground 207.

While the data input connector 202 is described with reference to FIG. 3 as comprising a differential signaling data input, in either overvoltage protection and reporting system 200 or 300, the data input connector 202 may comprise a single-ended signaling data input. Whether differential or single-ended signaling is used, the data input connector 202 may comprise a balanced line or unbalanced line input.

System 300 uses two input GDTs, each coupled to one of the input lines and does not require the failure of both GDTs to indicate a fault condition (or over-voltage event). The failure of just one of the pair is sufficient. A further advantage of such embodiments is that, as well as grounding at least one side of the data input, it provides a dedicated signal on the input fail sense output 322 which can be detected by external circuitry or devices.

On data output connector 214, output GDT 312a has a first terminal connected to the positive side of data output connector 214 and a second terminal connected to output fail sense output 324. The third terminal of output GDT 312a is connected to data ground 213. If output GDT 312a fails then first, second, and third terminals will be connected together. Thus, the positive side of data output connector 214 and the output fail sense output 324 will be pulled down to data ground 213. Similarly, output GDT 312b has a first terminal connected to the negative side of data output connector 214 and a second terminal connected to output fail sense output 324. The third terminal of output GDT 312b is connected to data ground 213. If output GDT 312b fails then first, second, and third terminals will be connected together. Thus, the negative side of data output connector 214 and the output fail sense output 324 will be pulled down to data ground 213. Failure of either one or both of output GDT 312a or output GDT 312b will pull one side of data output connector 214 and the output fail sense output 324 to data ground 213.

System 300 uses two output GDTs, each coupled to one of the output lines and does not require the failure of both GDTs to indicate a fault condition (or over-voltage event). The failure of just one of the pair is sufficient. A further advantage of such embodiments is that, as well as grounding at least one side of the data output, it provides a dedicated signal on the output fail sense output 324 which can be detected by external circuitry or devices.

In further embodiments input GDT 304a and input GDT 304b may be mounted adjacent to each other such that they are more likely to both fail in the event of a fault condition. Similarly, output GDT 312a and output GDT 312b may be mounted adjacent to each other such that they are more likely to both trigger in the event of a fault condition. In either case, however, triggering of both GDT devices is not necessary for failure detection.

In some embodiments, one or more of the surge protection systems 104 and 112 and the gas discharge tubes 204, 212, 304a, 304b, 312a and 312b may comprise "non-sacrificial" devices that do not require replacement following a surge-related failure, but rather function in a similar manner to a circuit breaker, either resetting automatically after the event causing the surge-related interruption has cleared, or requiring visual inspection and/or manual reset following the surge-related interruption.

While only some embodiments of the disclosure have been described herein, those skilled in the art, having benefit of this disclosure, will appreciate that other embodiments may be devised which do not depart from the scope of the disclosure herein. While the disclosure has been described in detail, it should be understood that various changes, substitutions, and alterations can be made hereto without departing from the spirit and scope of the disclosure.

What is claimed is:

1. An overvoltage protection and reporting system comprising:
   an input transceiver comprising a first input and a second input;
   an output transceiver comprising a first output and a second output;
   an input and output surge protection system, comprising:
      an input surge protection device coupled to the input transceiver, the input surge protection device including a first gas discharge tube coupled to the input transceiver only at the first input and a second gas discharge tube coupled to the input transceiver only at the second input, wherein the first gas discharge tube comprises a first terminal coupled to the first input, a second terminal coupled to a first ground, and a third terminal coupled to an input fail sense output; and
      an output surge protection device coupled to the output transceiver, the output surge protection device including a third gas discharge tube coupled to the output transceiver only at the first output and a fourth gas discharge tube coupled to the output transceiver only at the second output.

2. The overvoltage protection and reporting system of claim 1, further comprising:
   a processor coupled between the input transceiver and the output transceiver; and
   a sensor receiver coupled between the output transceiver and the processor,
   wherein the processor is configured to detect a failure of the output surge protection device based on a signal received from the sensor receiver.

3. The overvoltage protection and reporting system of claim 2, wherein the overvoltage protection and reporting system further comprises a resistor coupled between the sensor receiver and the output transceiver.

4. The overvoltage protection and reporting system of claim 2, wherein the processor is configured to detect a failure of the output surge protection device based on a difference between a signal received from the input transceiver and the signal received from the sensor receiver.

5. The overvoltage protection and reporting system of claim 1, wherein the input transceiver receives a differential input signal on the first input and the second input.

6. The overvoltage protection and reporting system of claim 1, wherein the second gas discharge tube comprises a first terminal coupled to the second input, a second terminal coupled to the first ground, and a third terminal coupled to the input fail sense output.

7. The overvoltage protection and reporting system of claim 6, wherein the output transceiver outputs a differential output signal on the first output and the second output.

8. The overvoltage protection and reporting system of claim 6, wherein the third gas discharge tube comprises a first terminal coupled to the first output, a second terminal coupled to a second ground, and a third terminal coupled to an output fail sense output.

9. The overvoltage protection and reporting system of claim 8, wherein the fourth gas discharge tube comprises a first terminal coupled to the second output, a second terminal coupled to the second ground, and a third terminal coupled to the output fail sense output.

10. The overvoltage protection and reporting system of claim 9, wherein the first and second gas discharge tubes are configured to fail to a closed-circuit configuration and wherein the third and fourth gas discharge tubes are configured to fail to a closed-circuit configuration.

11. The overvoltage protection and reporting system of claim 9, wherein the input fail sense output and the output fail sense output are configured to be detected by an external device.

12. An overvoltage protection and reporting system comprising:
   an input transceiver;
   an output transceiver;
   a processor coupled between the input transceiver and the output transceiver; and
   an output surge protection system, comprising:
      an output surge protection device coupled to an output of the output transceiver; and
      a sensor receiver coupled between the output of the output transceiver and the processor; and
      a resistor coupled between the sensor receiver and the output of the output transceiver;
   wherein the processor is configured to detect a failure of the output surge protection device based on a signal received from the sensor receiver.

13. The overvoltage protection and reporting system of claim 12, wherein the processor is configured to detect a failure of the output surge protection device based on a difference between a signal received from the input transceiver and the signal received from the sensor receiver.

14. The overvoltage protection and reporting system of claim 12, wherein:
   the output transceiver comprises a first output and a second output; and
   the output transceiver outputs a differential output signal on the first output and the second output.

15. The overvoltage protection and reporting system of claim 12 wherein:
   the output transceiver comprises a first output and a second output; and
   the output surge protection device comprises a first gas discharge tube comprising a first terminal coupled to the first output, a second terminal coupled to the second output, and a third terminal coupled to a first ground.

16. The overvoltage protection and reporting system of claim 15, wherein the first gas discharge tube is configured to fail to a closed-circuit configuration.

17. The overvoltage protection and reporting system of claim 12, further comprising:
   an input surge protection system, comprising an input surge protection device coupled to an input of the input transceiver.

18. The overvoltage protection and reporting system of claim 17 wherein:
   the input transceiver comprises a first input and a second input; and
   the input surge protection device comprises a second gas discharge tube comprising a first terminal coupled to the first input, a second terminal coupled to the second input, and a third terminal coupled to a second ground.

* * * * *